United States Patent [19]

Yamada

[11] Patent Number: 5,400,071
[45] Date of Patent: * Mar. 21, 1995

[54] SOLID-STATE IMAGE SENSING DEVICE HAVING A MULTI-ROW DIRECTION TRANSFER CIRCUIT

[75] Inventor: Tetsuo Yamada, Yokohama, Japan

[73] Assignee: Kabushiki Kaisha Toshiba, Kawasaki, Japan

[*] Notice: The portion of the term of this patent subsequent to Sep. 15, 2009 has been disclaimed.

[21] Appl. No.: 799,979

[22] Filed: Nov. 29, 1991

[30] Foreign Application Priority Data

Nov. 30, 1990 [JP] Japan .................. 2-336067

[51] Int. Cl.6 .............................................. H04N 3/14
[52] U.S. Cl. ....................................... 348/316; 348/323
[58] Field of Search ................. 358/213.23, 213.29, 358/213.11, 213.26, 213.25, 213.27; 348/311, 316, 324, 323

[56] References Cited

U.S. PATENT DOCUMENTS

| | | | |
|---|---|---|---|
| 4,635,122 | 1/1987 | Kato et al. | 358/213.29 |
| 4,816,916 | 3/1989 | Akiyama | 358/213.26 |
| 4,837,630 | 6/1989 | Ueda | 358/213.26 |
| 4,839,734 | 6/1989 | Takemura | 358/213.26 |
| 4,878,121 | 10/1989 | Hynecek | 358/213.26 |
| 4,897,728 | 1/1990 | Yamada | 358/213.19 |
| 5,043,819 | 8/1991 | Cheon et al. | 358/213.29 |
| 5,148,013 | 9/1992 | Yamada | 358/213.23 |

FOREIGN PATENT DOCUMENTS

| | | | |
|---|---|---|---|
| 0313322 | 4/1989 | European Pat. Off. | |
| 0315778 | 5/1989 | European Pat. Off. | |
| 59-122085 | 7/1984 | Japan | 358/213.29 |
| 59-154882 | 9/1984 | Japan | 388/213.29 |
| 63-278365 | 11/1988 | Japan | 358/213.29 |

Primary Examiner—Joseph Mancuso
Assistant Examiner—Wendy R. Greening
Attorney, Agent, or Firm—Foley & Lardner

[57] ABSTRACT

Column direction transfer sections provided every photosensitive element trains are such that the transfer direction of the odd columns and that of the even columns are opposite to each other. A conversion section for reversing the transfer order is connected to at least one final transfer stage of the column direction transfer sections, and charges transferred are thus transported to row direction transfer sections. Thus, it is possible to transfer and output, in the same direction, signal charges transferred in directions opposite to each other every columns to the two row direction transfer sections in such a manner that those signal charges are distributed thereto. For this reason, the number of transfer stages of each row direction transfer section can be reduced to one half, the dimension every stage can be twice larger than that of the prior art, and the operating frequency can be also reduced to one half.

11 Claims, 4 Drawing Sheets

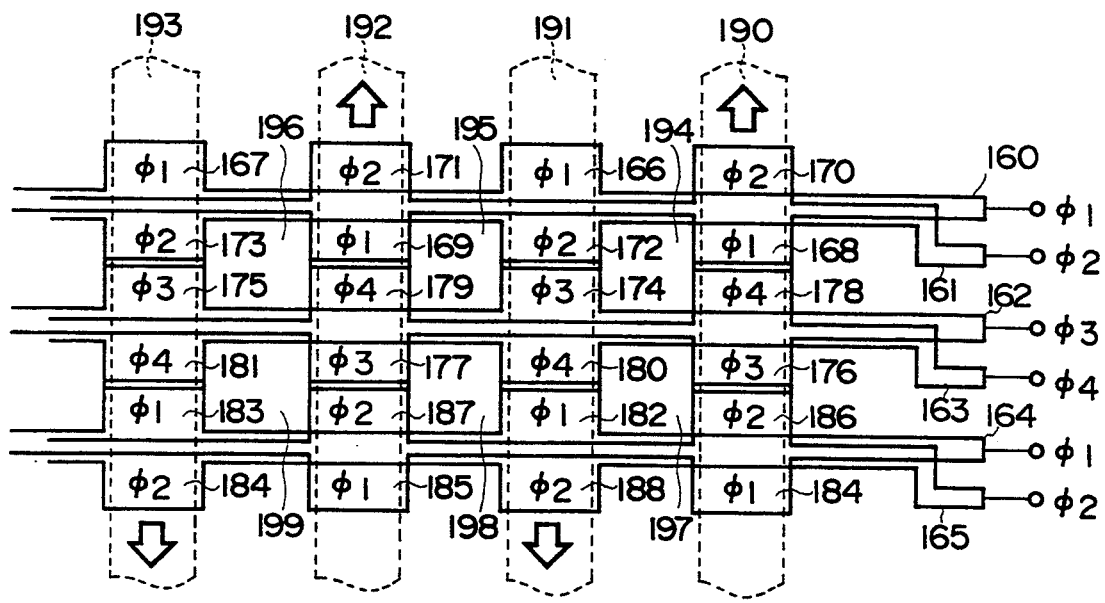
F I G. 3
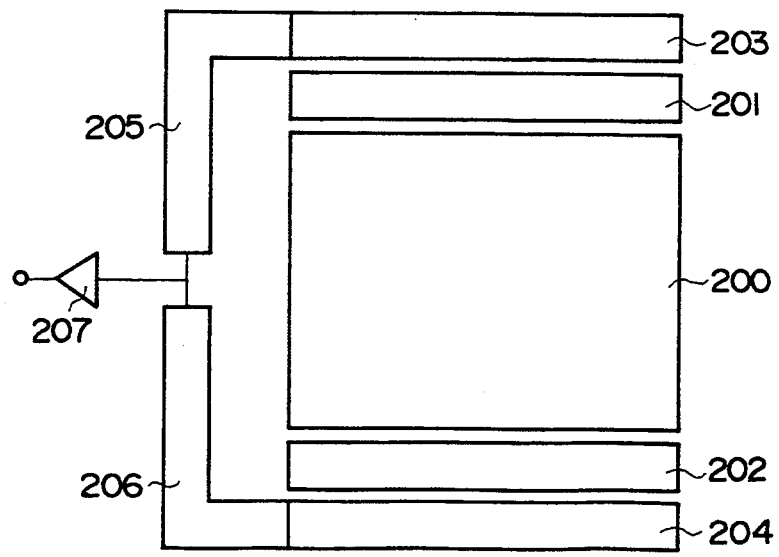
F I G. 4

SOLID-STATE IMAGE SENSING DEVICE HAVING A MULTI-ROW DIRECTION TRANSFER CIRCUIT

BACKGROUND OF THE INVENTION

This invention relates to a solid-state image sensing device, and more particularly to a structure suitable for miniaturized and many pixel implementation in a device.

As an example of CCD area sensors capable of providing high resolution of solid-state image sensing devices using charge transfer devices, it is known to have an area sensor of a structure in which photosensitive elements producing signal charges of two pixels constituting one line are arranged adjacently to each other in a column direction (vertical direction). However, in CCD area sensors generally used as a sensor for civil use, with a view to reducing the number of transfer stages requiring a broad area because of miniaturization requirement, a readout system is employed to add signal charges of two pixels adjacent in a column direction to read them out.

FIG. 1 is a plan view showing the configuration of a conventional solid-state image sensing device. Photosensitive element trains 11, 12, ... 18 each comprised of six photosensitive elements 1 to 6 are provided, and column transfer sections 21, 22, 23, 24, 25, 26, 27 and 28 each comprised of three transfer stages 7, 8 and 9 are provided adjacently to these photosensitive element trains. The transfer stage 7 corresponds to the photosensitive elements 5 and 6, the transfer stage 8 corresponds to the photosensitive elements 3 and 4, and the transfer stage 9 corresponds to the photosensitive elements 1 and 2.

Furthermore, S11, S21, ... S61 represent signal charges stored in the first photosensitive element train 11, and S12, S22 ... S62 represent signal charges stored in the second photosensitive element train 12. Reference symbols are similarly attached to other succeeding signal charges. For example, S18, S28, ... S68 represent signal charges stored in the eighth photosensitive element column 18.

At the lower part of FIG. 1 of the photosensitive element trains and column direction transfer sections, a row direction transfer section 10 for carrying out a transfer in a row direction (in a direction from the right-hand side to the left-hand side of paper) is provided. This row direction transfer section 10 includes transfer stages 31 to 38. An output circuit 39 is connected to a final transfer stage 31 of the row direction transfer section 10. This output circuit 39 reads out signal charges to the external.

In this solid-state image sensing device, a first field signal is formed by adding and transferring signal charges of two photosensitive elements adjacent in a column direction (in upper and lower directions of paper) to read them out to the external, and a second field signal is formed by adding and transferring signal charges of two photosensitive elements adjacent in the column direction and combined in a manner different from the above to output them. Further, by interlace-synthesizing two field signals, one frame signal is provided. Such a mode is called a field storage mode.

The operation of the above-mentioned conventional solid-state image sensing device will now be described by drawing attention only to one field.

Signal charges S11, S12 ... S18 of the first row and signal charges S21, S22 ... S28 of the second row, signal charges S31, S32 ... S38 of the third row and signal charges S41, S42 ... S48 of the fourth row, and signal charges S51, S52 ... S58 of the fifth row and signal charges S61, S62 ... S68 of the sixth row are transported to corresponding transfer stages, and are added thereat, respectively. Subsequently, signal charges S11+S21, S12+S22, ... S18+S28 correspondingly belonging to the first row of the signal charges added in a manner stated above are subjected to parallel-transfer to corresponding transfer stages 31 to 38 of the row direction charge transferring section 10. By transfer in a row direction of the row direction charge transfer section 10, signal charges are sequentially transferred to the output circuit 39, and are outputted therefrom to the external.

Then, added signal charges S31+S41, S32+S42, ... S38+S48 of the second row and those S51+S61, ... S58+S68 of the third row are outputted by the operation similar to the above. In this way, all signal charges can be outputted.

Meanwhile, in such a charge transfer device, since transfer stages 31 to 38 of the row direction transfer section are formed in such a manner that they are connected to respective transfer sections 21 to 28, the dimension in a row direction of one transfer stage must be formed so that it is equal to the arrangement pitch in the row direction of the photosensitive elements.

Furthermore, since four-phase drive is generally carried out in the row direction transfer section, one transfer stage is comprised of four electrodes. For this reason, the dimension of one electrode is one fourth or less of the pixel pitch. Accordingly, when the pixel pitch is reduced for the purpose of realizing miniaturization or many pixel implementation, high level miniaturization technology is required for forming the row direction transfer section.

On the other hand, if the number of photosensitive elements in a row direction is increased, the transfer rate required for reading out charges of one row within a predetermined time interval in conformity of the television system becomes high. Namely, the row direction transfer section must operate at a high frequency in proportion to the number of photosensitive element trains. This results in the problem that the burden on the transfer pulse supply driver is increased, leading to an increased power consumption.

SUMMARY OF THE INVENTION

Accordingly, an object of this invention is to provide a solid-state image sensing device of a novel structure in which the dimension of the row direction transfer section can be extended and the transfer pulse frequency is reduced.

According to the present invention, there is provided a solid-state image sensing device comprising; a photosensitive section in which a plurality of photosensitive element trains each having a plurality of photosensitive elements are arranged in a row direction, first column direction transfer means arranged adjacently to the odd photosensitive element trains, and for transferring, in a first direction, first signal charges produced in the photosensitive elements included in the photosensitive element trains, second column direction transfer means arranged adjacently to the even photosensitive element trains, and for transferring, in a second direction opposite to the first direction, second signal charges produced in the photosensitive elements included in the photosensitive element trains, first row direction transfer means including transfer stages provided in correspondence with respective columns of the first column direction transfer means, and adapted to receive the first signal charges from the final transfer stage of the first column direction transfer means to transfer them in a row direction, second row direction transfer means including transfer stages provided in correspondence with respective columns of the second column direction transfer means, and adapted to receive the second signal charges from the final transfer stage of the second column direction transfer means to transfer them in a row direction, a first output circuit for outputting, to the external, the first signal charges transferred by the first row direction transfer means, and a second output circuit for outputting, to the external, the second signal charges transferred by the second row direction transfer means, wherein first charge storage means for storing, for a predetermined time period, signal charges transferred, and having a charge transfer order conversion function to convert the transfer order thereof is provided between the first column direction transfer means and the first row direction transfer means.

In a solid-state image sensing device according to this invention, column direction transfer means (sections) provided every photosensitive element trains are such that the transfer direction of the odd columns thereof and that of the even columns thereof are opposite to each other. Transfer order conversion means is connected to at least one final transfer stage of the column direction transfer means, and charges transferred are transported to the row direction transfer means (sections). Thus, it is possible to transfer and output, in the same direction, signal charges transferred in directions opposite to each other at every column to two row direction transfer means in such a manner that such signal charges are distributed thereto.

As stated above, since signal charges produced in the photosensitive element trains are transported to the two row direction transfer sections in such a manner that those signal charges are distributed thereto, the dimension of every stage of each row direction transfer section can be twice larger than that of the conventional one. For this reason, difficulty in miniaturization is relaxed to a great degree, thus making it possible to eliminate hindrance in the manufacturing technology or the design technology. Further, since the number of transfer stages of one row direction transfer section is reduced to one half, the operating frequency required for implementation of an imaging device comprised of many pixels can be reduced to one half. As a result, not only the operation and the signal processing are facilitated, but also the burden on the peripheral driver circuit as an operating voltage supply source is reduced, so power consumption can be reduced and the circuit configuration can be simplified. Thus, a solid-state image sensing device suitable for miniaturization and/or many-pixel implementation can be provided.

BRIEF DESCRIPTION OF THE DRAWINGS

In the accompanying drawings;

FIG. 3 is a plan view showing the detailed configuration of the first and second column direction transfer sections of this invention, FIG. 4 is a plan view showing the configuration of a solid-state image sensing device according to a second embodiment of this invention.

DESCRIPTION OF THE PREFERRED EMBODIMENTS

Figure 1:
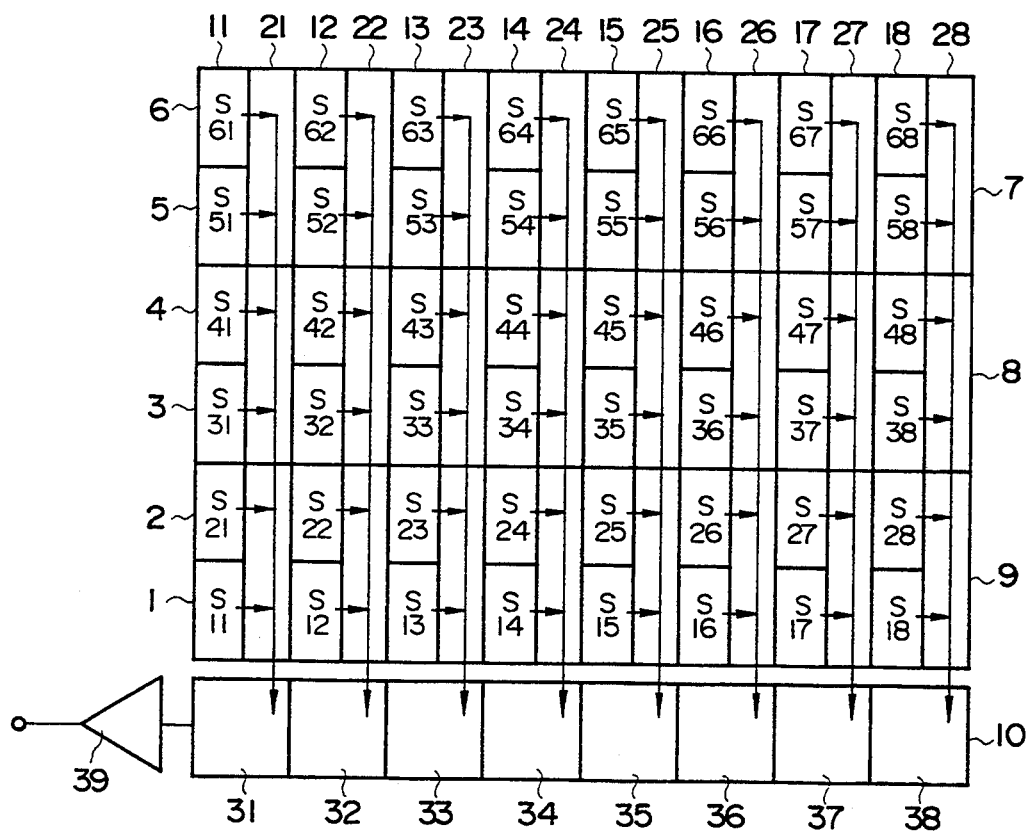
FIG. 1 is a plan view showing the configuration of a conventional solid-state image sensing device.
Figure 2:
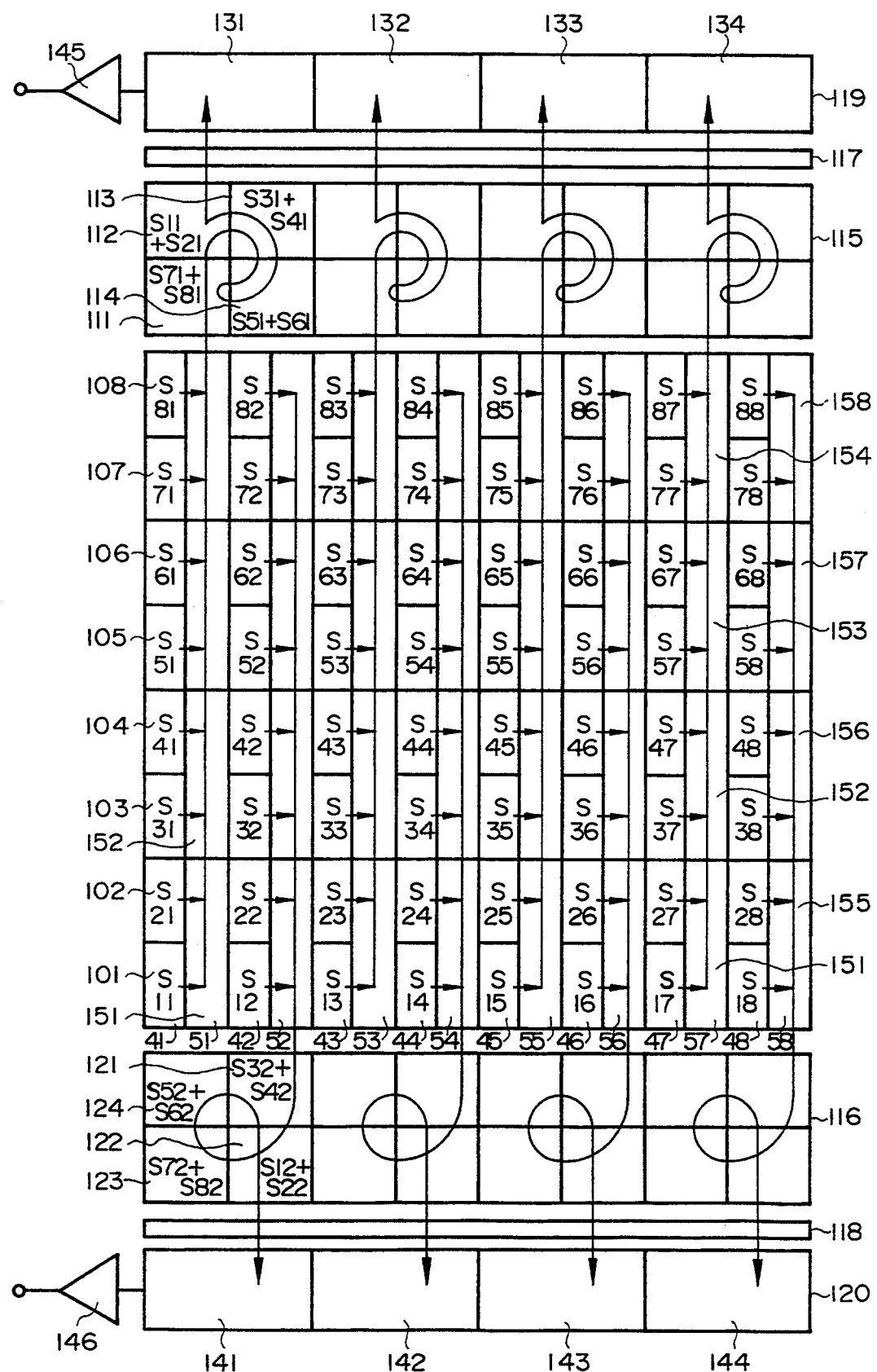
FIG. 2 is a plan view showing the configuration of a solid-state image sensing device according to a first embodiment of this invention.

FIG. 2 is a plan view showing the configuration of a first embodiment of this invention.

In this embodiment, there are provided eight photosensitive element trains 41 to 48 of the first to eighth columns and first to eighth column direction transfer sections 51 to 58 for transferring signal charges of photosensitive elements of the photosensitive element trains. Each photosensitive element train is comprised of photosensitive elements 101 to 108. Further, column direction transfer sections 51, 53, 55 and 57 belonging to the odd columns of the column transfer sections are first column direction transfer sections for transferring charges from the lower part to the upper part of paper. On the other hand, column direction transfer sections 52, 54, 56 and 58 belonging to the even columns are second column direction transfer sections for transferring charges from the upper part to the lower part of paper. The first and second column direction transfer sections include transfer stages 151 to 154 and transfer stages 155 to 158, respectively.

On the upper and lower sides of the photosensitive element trains and the column direction transfer sections, first and second charge storage sections 115 and 116 are provided, respectively. The first charge storage sections 115 and 116 are comprised of four subsections, respectively. Each subsection of the first charge storage section 115 includes transfer stages 111 to 114 having a transfer order conversion function. Namely, these transfer stages form a cyclic transfer path in which a transfer in a clockwise direction and a transfer in a counterclockwise direction can be conducted. The transfer stages 111 of the first charge storage section 115 are connected to the transfer stages 154 of the column direction transfer sections. It is to be noted that the detail of these cyclic transfer paths is disclosed in U.S. Pat. No. 4,897,728 by the same inventor as the inventor of this invention.

Furthermore, each subsection of the second charge storage section 116 includes transfer stages 121 to 124. It should be noted that these transfer stages are not necessarily required to have a transfer order conversion function as stated above. The transfer stages 155 of the second column direction transfer sections are connected to the transfer stages 121.

At opposite positions of the transfer stages 112 of the subsections constituting the first charge storage section 115 of respective columns, respective transfer stages 131 to 134 of a first row direction transfer section 119 are provided through a control gate 117. This row direction transfer section 119 serves to transfer, in a direction from the transfer stage 134 to the transfer stage 131, signal charges stored and transferred by the subsections constituting the first charge storage section 115 and transported by opening the control gate 117. An output circuit 145 is connected to the transfer stage 131.

Similarly, at opposite positions of the transfer stages 122 of the subsections constituting the second charge storage section 116 of respective columns, respective transfer stages 141 to 144 of a second row direction transfer section 120 are provided through a control gate 118. This row direction transfer section 120 serves to transfer, in a direction from the transfer stage 144 to the transfer stage 141, signal charges stored and transferred by the subsections constituting the second charge storage section 116 and transported by opening the control gates 118. An output circuit 146 is connected to the transfer stage 141.

The principle in the operation in one field of the device according to this invention will now be described.

Signal charges Smn (m=1 to 8, n=1 to 8) stored for a predetermined time period in the photosensitive elements are transported to corresponding transfer stages 151 to 158 in the same manner as in the prior art, respectively. In this case, charges of two photosensitive elements adjacent in a column direction similar to that of the prior art are added, and are then stored into respective first and second column direction transfer stages. Subsequently, by the first charge storage sections, charge bundles S8n+S7n, S6n+S5n, S4n+S3n, and S2n+S1n (n=1, 3, 5, 7) are transferred from the lower part to the upper part in FIG. 2, and are further transferred to the first charge storage section 115 in the same order. At the same time, by the second column direction transfer sections, charge bundles S1n+S2n, S3n+S4n, S5n+S6n, and S7n+S8n (n=2, 4, 6, 8) are transferred from the upper part to the lower part in FIG. 2, and are further transferred to the second charge storage section 116 in the same order.

In the first charge storage section 115, every time charge bundles are transported, cyclic transfer is carried out. As a result, transfer is completed under the state where charge bundles S1n+S2n, S3n+S4n, S5n+S6n, and S7n+S8n (n=1, 3, 5, 7) are stored in the transfer stages 112, 113, 114 and 111, respectively.

Similarly, in the second charge storage section 116, cyclic transfer is carried out in such a manner that charge bundles S1n+S2n, S3n+S4n, S5n+S6n, and S7n+S8n (n=2, 4, 6, 8) are stored into the transfer stages 122, 121, 124, and 123, respectively.

Then, when a control gate is applied to the control gate 117, so the gate is opened, charge bundles S11+S21, S13+S23, S15+S25 and S17+S27 are transferred from the respective transfer stages 112 of the first charge subsections (section) 115 of respective columns to the transfer stages 131 to 134 of the first row direction transfer section 119, respectively. These charge bundles are sequentially subjected to row direction transfer in a left direction in FIG. 2, whereby they are read out from the output circuit 145. Similarly, when a control voltage is applied to the control gate 118, so the gate is opened, charge bundles S12+S22, S14+S24, S16+S26 and S18+S28 are transferred from the respective transfer stages 122 of the second charge storage subsections (section) 116 of respective columns to the transfer stages 141 to 144 of the second row direction transfer section 120, respectively. These charge bundles are sequentially subjected to row direction transfer in a left direction, whereby they are read out from the output circuit 146. Then, in the first charge storage section 115, transfer in a counterclockwise direction is carried out. As a result, the charge bundles which have been stored in the transfer stages 113 from that time are transferred to the transfer stages 112. These charge bundles are transferred to the row direction transfer section, and are then read out therefrom. Further, in the second charge storage section 116, transfer in a clockwise direction is carried out. As a result, charge bundles which have been stored in the transfer stages 121 until that time are transferred to the transfer stages 122. Then, these charge bundles are transferred to the row direction transfer section, and are then read out therefrom.

At times subsequent thereto, signal charge bundles which have been stored in the transfer stages 114 and 111 of of the first charge storage section 115 are transferred in a counterclockwise direction, and signal charge bundles which have been stored in the transfer stages 124 and 123 of the second charge storage section 116 are transferred in a clockwise direction. The charge bundles thus transferred are read out. By repeatedly performing such an operation for one field time period, it is possible to read out all signal charges to the external.

It is to be noted that, in order to allow time series of signal charges outputted from the two output circuits to be in correspondence with each other with respect to the arrangement order of photosensitive elements in a row direction, a control may be conducted in a manner to cause the timing of signal charges outputted from the output unit 146 to lag by phase angle of 180 degrees with respect to the output timing of the output unit 145.

Furthermore, a charge storage section which does not carry out reversion of the charge storage sections may be of a structure to carry out a linear transfer in addition to the cyclic transfer as shown. In addition, by adjusting the number of transfer stages of the row direction transfer section on the other side in correspondence with the operation of the reversible cyclic transfer path, an arrangement in which no charge storage section is provided on the other side may be employed.

As stated above, the solid-state imaging device according to this invention can transport signal charges produced in the photosensitive elements to the two row direction transfer sections 119 and 120 in such a manner that those signal charges are respectively distributed thereto. Accordingly, the dimension of every stage of each row direction transfer section can be twice larger than that of the prior art. For this reason, the difficulty in miniaturization is relaxed to a great degree, so that obstruction in the manufacturing technology or the design technology can be eliminated. Further, since the number of transfer stages of one row direction transfer section becomes one half, the operating frequency which might be necessarily increased when an imaging device comprised of many pixels was conventionally implemented can be reduced to one half. As a result, not only the operation and the signal processing are facilitated, but also the burden on the periphery driver circuit as an operating voltage supply source is reduced. Thus, low power consumption and/or simplification of the circuit can be realized.

FIG. 3 is a partial structural diagram showing a plan structure of the first and second column transfer sections in the embodiment shown in FIG. 2.

In this figure, a typical four-phase drive charge coupled device (CCD) of a double layer laminate electrode structure is used. This transfer device as the transfer section includes electrode end portions 160 and 164 to which a transfer pulse $\phi 1$ of the first phase is applied, electrode end portions 161 and 165 to which a transfer pulse $\phi 2$ of the second phase is applied, an electrode end portion 162 to which a transfer pulse $\phi 3$ of the third phase is applied, and an electrode end portion 163 to which a transfer pulse $\phi 4$ of the fourth phase is applied. The electrodes supplied with transfer pulses $\phi 2$ and $\phi 4$ are comprised of a conductive material of the first layer, e.g., polysilicon, and the electrodes supplied with transfer pulses $\phi 1$ and $\phi 3$ are comprised of a conductive material of the second layer.

In this figure, photosensitive elements 194 to 199 are arranged in a matrix form. Between these photosensitive element trains, column direction transfer paths 190 to 193 are provided. The transfer pulse $\phi 1$ is delivered from the electrode end portion 160 to transfer electrodes 166 to 169 integrally formed. Similarly, the transfer pulse $\phi 2$ is delivered from the electrode end portion 161 to transfer electrodes 170 to 173 integrally formed, the transfer pulse $\phi 3$ is delivered from the electrode end portion 162 to transfer electrodes 174 to 177 integrally formed, the transfer pulse $\phi 4$ is delivered from the electrode end portion 163 to transfer electrodes 178 to 181 integrally formed, the transfer pulse $\phi 1$ is delivered from the electrode end portion 164 to transfer electrodes 182 to 185 integrally formed, and the transfer pulse $\phi 2$ is delivered from the electrode end portion 165 to transfer electrodes 186 to 189 integrally formed.

In such a configuration, transfer paths 190 and 192 are comprised of transfer electrodes arranged in succession in order of $\phi 1$, $\phi 2$, $\phi 3$ and $\phi 4$ from the lower part to the upper part of FIG. 3. Thus, signal charges are transferred to the upper part of paper through these transfer paths. On the other hand, transfer paths 191 and 193 are comprised of transfer electrodes in succession in order of $\phi 1$, $\phi 2$, $\phi 3$ and $\phi 4$ from the upper part to the lower part of FIG. 3. Thus, signal charges are transferred to the lower part of FIG. 3 through these transfer paths 191 and 193. As stated above, between adjacent transfer sections, electrodes to which the transfer pulses $\phi 1$ and $\phi 2$ are applied are arranged one after another, and electrodes to which the transfer pulses $\phi 3$ and $\phi 4$ are applied are arranged one after another. Thus, first and second column direction transfer sections of which transfer directions are opposite to each other can be easily realized.

A second embodiment of a solid-state image sensing device according to this invention is shown in FIG. 4.

On the upper and lower sides of the section 200 including photosensitive elements and first and second column direction transfer sections, first and second charge storage sections 201 and 202 are provided, respectively. At least one of these charge storage sections has a transfer order conversion function. Further, first and second row direction transfer sections 203 and 204 are provided adjacently to the first and second charge storage sections 201 and 202 and in parallel thereto. In addition, expanded transfer paths 205 and 206 are coupled to the terminating points of these row direction transfer sections. These expanded transfer paths serve to receive charges from the row direction transfer sections 203 and 204 to transfer them to a single output circuit 207.

The transfer from the extended transfer path 205 to the output circuit 207 and the transfer from the extended transfer path 206 to the output circuit 207 are controlled in a manner that the phases of their transfer timings are different by 180 degrees. As a result, signal charges transferred through the both transfer paths are synthesized in a time series manner without being added. This is readily accomplished by transferring charges to the output circuit 207, e.g., by using pulses having phases opposite to each other of a two-phase clock in the both transfer paths.

Figure 5:
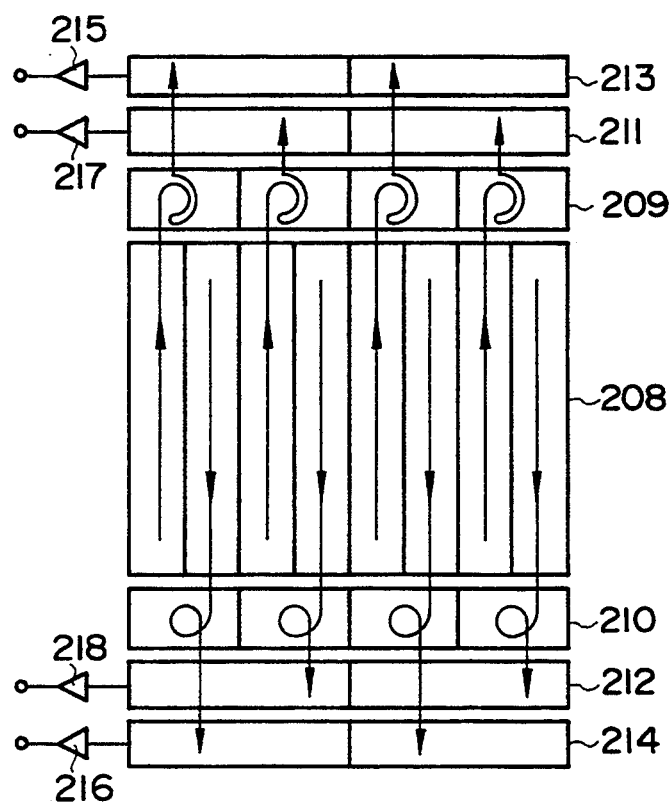
FIG. 5 is a plan view showing the configuration of a solid-state image sensing device according to a third embodiment of this invention.

FIG. 5 shows a third embodiment of this invention.

On the upper and lower sides of the section 208 of the same structure as that of the photosensitive element portion indicated by reference numeral 200, first and second charge storage sections 209 and 210 are provided, respectively. The first charge storage section 209 has a transfer order conversion function.

Unlike the embodiment shown in FIG. 2, the first row direction transfer section provided adjacently to the first charge storage section 209 includes two row direction transfer paths 211 and 213 arranged in parallel. Further, the second row direction transfer section similarly includes two row direction transfer paths 212 and 214 arranged in parallel. Additionally, four output circuits 215 to 218 for outputting charges which have been transferred are provided at the terminating portions of the respective row direction transfer paths.

In this embodiment, row direction transfer is carried out by using four row direction transfer paths. Thus, the dimension in a row direction every transfer stage can be four times larger than that of the prior art, and the transfer frequency can be one fourth of that of the prior art.

Figures 6, 7:
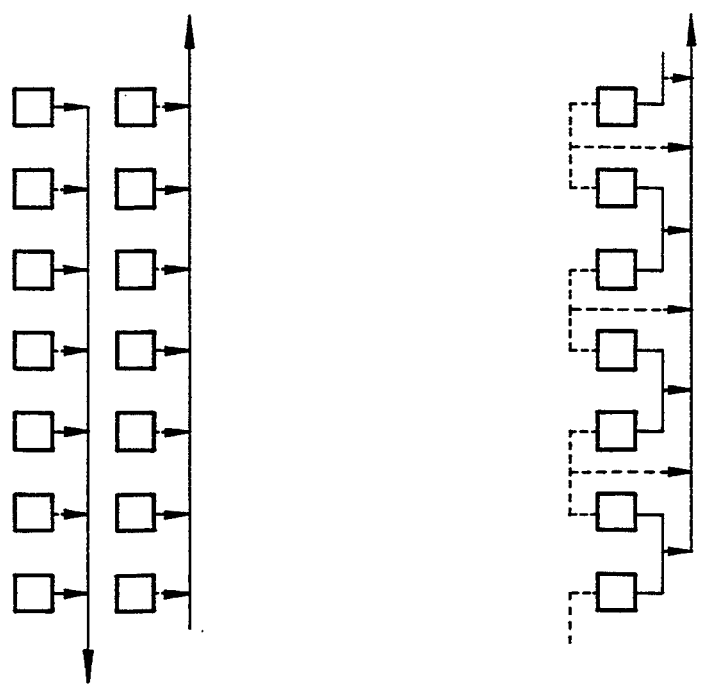
FIG. 6 is an explanatory view showing another example of how signal charges are taken out from the photosensitive element trains.
FIG. 7 is an explanatory view showing a further example of how signal charges are taken out from the photosensitive element trains.

While, in the above-described embodiments, the column direction transfer section serves to add signal charges produced in photosensitive elements corresponding to two pixels adjacent in a column direction to transfer them, an arrangement as shown in FIG. 6 may be employed to alternately take out signal charge produced in the photosensitive elements every field. In addition, an arrangement as shown in FIG. 7 may be employed such that, in the additive readout of two pixels similar to that in the above-described embodiments, combination of two pixels is varied by one pixel every field. It is to be noted that the solid lines and the broken lines represent first and second fields in FIGS. 6 and 7, respectively.

What is claimed is:

1. A solid-state image sensing device comprising;
  a photosensitive section in which a plurality of photosensitive element trains each having a plurality of photosensitive elements being arranged in a column direction;
  first column direction transfer means arranged adjacently to the odd-numbered photosensitive element trains, and for transferring, in a first direction, first signal charges produced in the odd-numbered photosensitive elements included in said photosensitive element trains;
  second column direction transfer means arranged adjacently to the even-numbered photosensitive element trains, and for transferring, in a second direction opposite to said first direction, second signal charges produced in the even-numbered photosensitive elements included in said photosensitive element trains;

first row direction transfer means including transfer stages provided in correspondence with respective columns of said first column direction transfer means, and adapted to receive said first signal charges from a first final transfer stage of said first column direction transfer means to transfer said first signal charges in a row direction;

second row direction transfer means including transfer stages provided in correspondence with respective columns of said second column direction transfer means, and adapted to receive said second signal charges from a second final transfer stage of said second column direction transfer means to transfer said second signal charges in the row direction;

a first output circuit for outputting, to the external, said first signal charges transferred by said first row direction transfer means;

a second output circuit for outputting, to the external, said second signal charges transferred by said second row direction transfer means; and first charge storage means for storing, for a predetermined time period, said signal charges transferred, and having a charge transfer order conversion function to reverse the transfer sequence in the first row direction transfer means for reading out the signal charges, said first charge storage means being provided within a region above both of said first and its adjacent second column direction transfer means and under said first row direction transfer means.

2. A solid-state image sensing device as set forth in claim 1, wherein said first charge storage means is comprised of cyclic transfer stages having a structure such that its transfer path circulates, permitting transfers in clockwise and counterclockwise directions to be selectively carried out by controlling voltages applied to a plurality of transfer electrodes constituting said respective transfer stages.

3. A solid-state image sensing device as set forth in claim 1, further comprising second charge storage means for storing transferred signal charges for the predetermined time period, said second charge storage means being provided within a region under both of the first column direction transfer means and its adjacent second column direction transfer means and above said second row direction transfer means.

4. A solid-state image sensing device as set forth in claim 3, wherein said second charge storage means further includes a charge transfer direction conversion function to convert its transfer order.

5. A solid-state image sensing device as set forth in claim 4, wherein said second charge storage means is comprised of cyclic transfer stages having a structure such that its transfer path circulates, permitting transfers in clockwise and counterclockwise directions to be selectively carried out by controlling voltages applied to transfer electrodes constituting said respective transfer stages.

6. A solid-state image sensing device as set forth in claim 1, wherein said first and second column transfer means has electrodes to which control voltages of a same phase are applied, said electrodes being electrically connected in an area between elements of said photosensitive element trains, said electrodes and adjacent electrodes to which control voltages of phases other than said phase are applied being formed one after another through insulating films.

7. A solid-state image sensing device as set forth in claim 1, wherein said electrodes of said first and second row direction transfer means are arranged in a manner such that said phases of signal charges transferred by said first and second row direction transfer means and outputted from said respective output circuits are different from each other by 180 degrees.

8. A solid-state image sensing device as set forth in claim 1, wherein said first and second output circuits are electrically connected, first and second extension transfer paths for transferring signal charges to said output circuits being coupled to said first and second row direction transfer sections, respectively, electrodes being arranged so that signal charges are outputted as an image signal synthesized in a time series manner from said output circuit formed integrally.

9. A solid-state image sensing device as set forth in claim 1, wherein each of said first and second row direction transfer means is comprised of two row direction transfer paths arranged in parallel, signal charges transferred by said respective column direction transfer sections being alternately transferred to said first and second row direction transfer paths.

10. A solid-state image sensing device as set forth in claim 1, wherein said first and second column direction transfer means serve to transfer in sequence signal charges produced in the respective photosensitive elements of said respective photosensitive element trains.

11. A solid-state image sensing device as set forth in claim 1, wherein said first and second column direction transfer means serve to sequentially transfer signal charges produced in the photosensitive elements corresponding to two pixels adjacent in a column direction of the photosensitive elements.

* * * * *